United States Patent
Witcraft et al.

(10) Patent No.: US 6,717,403 B2
(45) Date of Patent: Apr. 6, 2004

(54) METHOD AND SYSTEM FOR IMPROVING THE EFFICIENCY OF THE SET AND OFFSET STRAPS ON A MAGNETIC SENSOR

(75) Inventors: William F. Witcraft, Minneapolis, MN (US); Joon-Wan Kang, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/947,733

(22) Filed: Sep. 6, 2001

(65) Prior Publication Data

US 2003/0042901 A1 Mar. 6, 2003

(51) Int. Cl.[7] .............................................. G01R 33/02
(52) U.S. Cl. ..................................... 324/252; 338/32 R
(58) Field of Search ................................ 324/252, 228, 324/117 R, 202, 225; 338/32 R; 327/510; 257/108; 428/692

(56) References Cited

U.S. PATENT DOCUMENTS

| | | | |
|---|---|---|---|
| 3,696,506 A | * 10/1972 | Sinclair | 29/604 |
| 4,922,606 A | * 5/1990 | Alexander et al. | 29/839 |
| 5,055,786 A | * 10/1991 | Wakatsuki et al. | 324/252 |
| 5,247,278 A | 9/1993 | Pant et al. | 338/32 R |
| 5,508,867 A | 4/1996 | Cain et al. | 360/113 |
| 5,592,082 A | * 1/1997 | Kuriyama | 324/252 |
| 5,644,456 A | 7/1997 | Smith et al. | 360/113 |
| 5,742,162 A | 4/1998 | Nepela et al. | 324/252 |
| 5,820,924 A | 10/1998 | Witcraft et al. | 427/130 |
| 5,831,426 A | 11/1998 | Black, Jr. et al. | 324/127 |
| 5,952,825 A | 9/1999 | Wan | 324/252 |

FOREIGN PATENT DOCUMENTS

| | | | |
|---|---|---|---|
| DE | 19740408 A1 | 3/1998 | G01R/33/09 |
| DE | 19648879 A1 | 6/1998 | G01R/33/09 |

OTHER PUBLICATIONS

International Search Report from International Application No. PCT/US02/28421, dated Dec. 9, 2002.

* cited by examiner

Primary Examiner—N. Le
Assistant Examiner—Reene Aurora
(74) Attorney, Agent, or Firm—McDonnell Boehnen Hulbert & Berghoff

(57) ABSTRACT

A method for manufacturing a magnetic field sensor, including the step of providing a keeper material proximate to at least a portion of a magnetic field sensing structure. The magnetic field sensor includes at least a substrate, the magnetic field sensing structure, and at least one current strap.

49 Claims, 5 Drawing Sheets

METHOD AND SYSTEM FOR IMPROVING THE EFFICIENCY OF THE SET AND OFFSET STRAPS ON A MAGNETIC SENSOR

BACKGROUND OF THE INVENTION

The present invention relates in general to magnetic field and current sensors and more particularly to magnetic field sensors that utilize chip or conductive straps to apply a current induced field to the sensor.

Magnetic field sensors have applications in magnetic compassing, ferrous metal detection, and current sensing. They may detect magnetic field variations in machine components, the earth's magnetic fields, underground minerals, or electrical devices and lines.

In these situations, one may use a magnetoresistive ("MR") sensor that is able to detect small shifts in magnetic fields. Such MR sensors may be formed using typical integrated circuit fabrication techniques. Typically, MR sensors use permalloy, a ferromagnetic alloy containing nickel and iron, as the magnetoresistive material. Often, the permalloy is arranged in thin strips of permalloy film. Such strips are usually several times longer than they are wide, and each strip will have a long—or "easy"—axis and a short axis. Moreover, through the design of the strips or through the use of an external field, the strips may often be magnetized in a particular direction—for example the easy axis—while in a default or reset state. Even so, an external magnetic field may act on a strip to rotate its magnetization direction away from the reset state magnetization direction.

When a current is run through an individual strip, the magnetization direction of the strip may form an angle with the direction of current flow. As the magnetization direction changes, the effective resistance of the strip changes. Particularly, a magnetization direction parallel to the current flow direction results in maximum resistance through the strip and a magnetization direction perpendicular to the current flow direction results in minimum resistance through the strip.

Therefore, when an external magnetic field acts on a permalloy strip to rotate its magnetization direction, the resistance of the strip may change. This changed resistance may cause a change in voltage drop across the strip when a current is run through the strip. This change in voltage may be measured as an indication of change in the magnetization direction of external magnetic fields acting on the strip.

To form the magnetic field sensing structure of a MR sensor, several permalloy strips may be electrically connected together. The permalloy strips may be placed on the substrate of the MR sensor as a continuous resistor in a "herringbone" pattern or as a linear strip of magnetoresistive material, with conductors across the strip at an angle of 45 degrees to the long axis of the strip. This latter configuration is known as "barber-pole biasing." It may force the current in a strip to flow at a 45-degree angle to the long axis of the strip, because of the configuration of the conductors. These sensing structure designs are discussed in U.S. Pat. No. 4,847,584, Jul. 11, 1989, to Bharat B. Pant and assigned to the same assignee as the current application. U.S. Pat. No. 4,847,584 is hereby fully incorporated by reference.

Whatever the configuration of the magnetoresistive material, the magnetization direction of the materials must be set in a single domain state for the purposes of repeatability of measurement. Unfortunately, this domain setting may be upset after manufacture by the presence of powerful magnetic fields near the magnetoresistive material. Though, in certain designs, large external magnets can be specifically placed to reset the domain setting, this may not be feasible when the MR sensor has already been packaged into a system. Particularly, some situations require several sensors within a single package to be magnetized in opposite directions. In this case, one can wrap individual coils around each sensor, but individual coils are expensive and are often unable to generate the large fields required to reset the sensors.

Alternately, current straps, known as set-reset straps and offset straps, may be used for resetting the domain state of an MR sensor and for biasing an MR sensor, respectively. U.S. Pat. No. 5,247,278 also to Bharat B. Pant, discloses the use of current straps for this purpose. U.S. Pat. No. 5,247,278 is hereby fully incorporated by reference.

Set-reset straps and offset straps may be utilized before every measurement, if desired. However, in some applications, it may be preferable to use set-reset and/or offset straps only in certain instances, such as upon power-up of an MR sensor device. Similarly, the occurrence of an anomalous magnetic field may be an appropriate time for using set-reset straps and/or offset straps, in order to reset the domain state of an MR sensor and/or to bias an MR sensor. The set-reset and offset straps could also be used for compensating for stray fields, calibration, current measurements, or magnetic initialization (startup).

These set-reset straps and offset straps provide a more efficient means of resetting and biasing an MR sensor than external means that are larger and more expensive. Moreover, because the straps may be formed by deposition on the same substrate as the MR sensor, the straps may be located closer to the magnetic field sensing structure than other means might be. This may allow for less energy to be used in resetting or biasing the MR sensor.

Further, because of size or other constraints, these straps may be only a few microns thick. Unfortunately, because of a need for a certain strength magnetic field to reset or bias a magnetic field sensing structure, the straps may not be of sufficient size to maintain the amount of current flow necessary to generate the required reset or biasing magnetic field. Moreover, even if straps are able to maintain this current flow, the design of the device may not allow for a power source with the ability to generate such a current or to generate such a current for a desired amount of time.

SUMMARY OF THE INVENTION

In one embodiment of the present invention, a method for manufacturing a magnetic field sensor includes the step of providing a keeper material proximate to a magnetic field sensing structure. The sensor includes a substrate, a current strap, and the magnetic field sensing structure.

Another embodiment of the present invention provides either a set-reset strap or an offset strap as the current strap. This embodiment may also include both a set-reset strap and an offset strap in the same sensor.

In a preferred embodiment of the present invention, the magnetic field sensing structure also includes permalloy strips electrically connected to one another and to an output terminal, where a magnetic field indication is produced.

The foregoing and other features and advantages of the system and method will be apparent from the following more particular description of preferred embodiments of the system and method as illustrated in the accompanying drawings in which like reference characters refer to the same parts throughout the different views.

BRIEF DESCRIPTION OF THE DRAWINGS

Preferred embodiments of the present inventions are described with reference to the following drawings, wherein.

DETAILED DESCRIPTION

Figure 1:
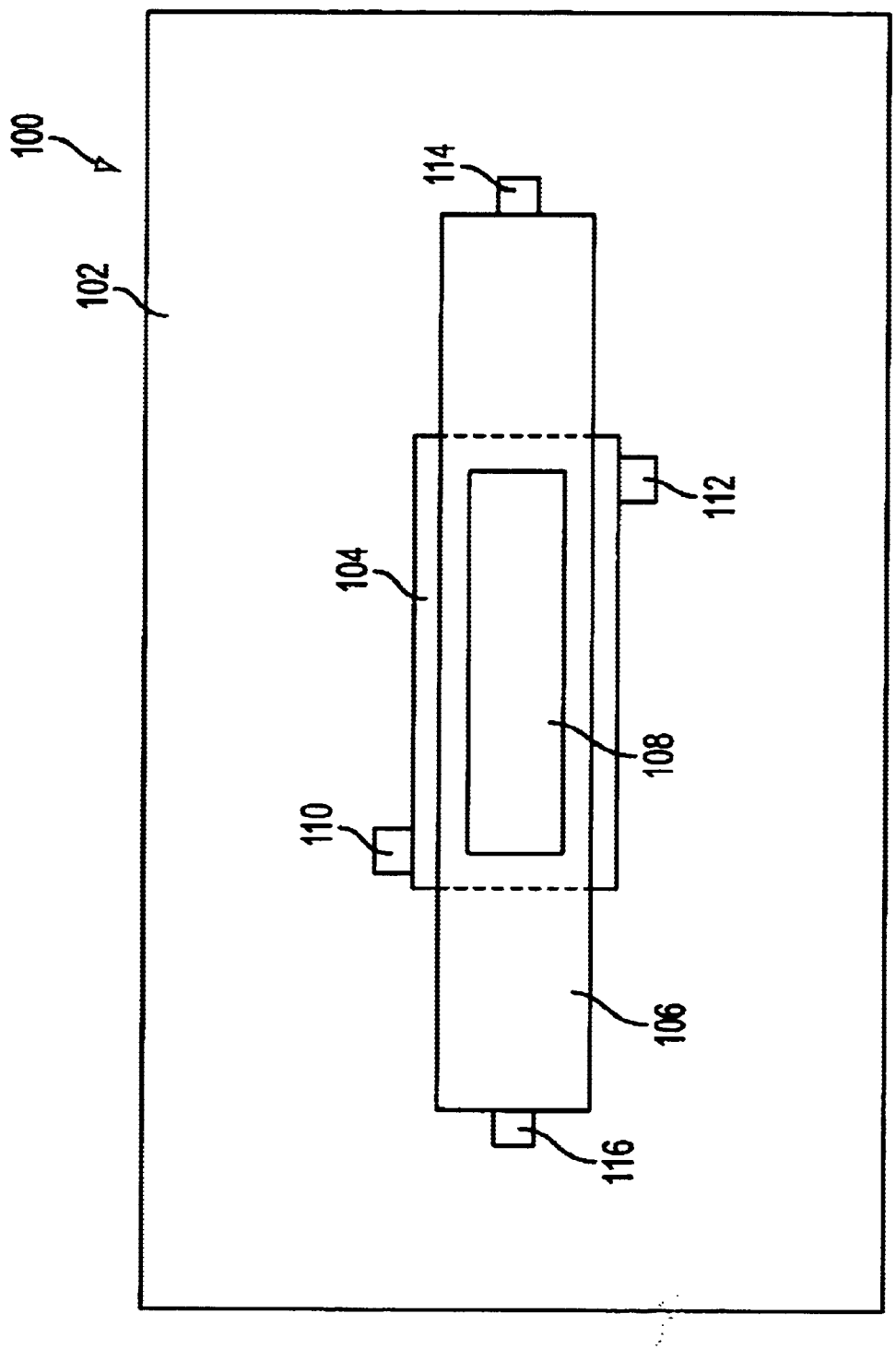
FIG. 1 is a diagram illustrating a sensor in accordance with the present invention.

FIG. 1 shows a magnetic field sensor 100 which includes a substrate 102, a magnetic field sensing structure 104, sensing terminals 110, 112, a set-reset strap 106, set-reset terminals 114, 116, and keeper material 108.

The substrate 102 provides a base for the magnetic field sensor 100 and may comprise a silicon wafer, a glass layer, or another appropriate material. Located above the substrate 102, the magnetic field sensing structure 104 detects magnetic fields. The magnetic field sensing structure 104 may comprise any of the materials and configurations known in the art for magnetic field sensing.

Further, the sensing structure 104 of FIG. 1 connects to the sensing terminals 110, 112. Upon passing a known current into the sensing terminal 110, through the sensing structure 104, and out of the sensing terminal 112, the voltage drop across the sensing terminals 110, 112 may be measured. From this, the resistance of the sensing structure 104 to the known current may be calculated.

When an external magnetic field is applied to the sensing structure 104, this external magnetic field may alter the direction of the magnetic field of the sensing structure 104, essentially altering the direction of current flow through the sensing structure 104. This alteration of the direction of current flow may change the resistance of the sensing structure 104. This change in resistance may serve as an indication of the direction of the external magnetic field.

The set-reset strap 106 may be formed of a conductive material, one example being aluminum. The sensor 100 may utilize a variety of current straps, such as an offset strap, in place of or in addition to the set-reset strap. The set-reset strap 106 connects to the set-reset terminals 114, 116. When a current of sufficient magnitude is run between the set-reset terminals 114, 116 and through the set-reset strap 106, the magnetic flux generated around the set-reset strap 106 may reset the sensing structure 104 into a single magnetic domain. By orienting the sensing structure 104 in a single magnetic domain, one may establish a "baseline" state from which the sensing structure 104 may more uniformly respond to an external magnetic field.

As an example of this uniform response, if the sensing structure 104 is oriented in a first direction—in this case, the baseline state direction—one may measure a first voltage drop across the sensing terminals 110, 112 when running a known current through the sensing terminals 110, 112. From the known current and the first voltage drop, a first resistance may be calculated. In this case, the first resistance should remain constant, as long as the sensing structure 104 is oriented in the first, or baseline, direction. Under similar circumstances, when the sensing structure 104 is oriented in the baseline direction, the first resistance should serve as a baseline resistance for the sensing structure 104. This baseline resistance should remain constant, and it may be used as a benchmark against which changes in resistance may be measured.

Continuing our example, we may apply an external magnetic field to the MR sensor. The external magnetic field may cause the magnetic field structure to be oriented in a second magnetization direction. For the sake of this example, let us assume that the second magnetization direction is rotated twenty degrees from the first magnetic direction. By again running a known current through the sensing terminals 110, 112, we may measure a second voltage drop and calculate a second resistance corresponding to the second magnetization direction. Taking the difference between the second resistance to the first resistance yields a first resistance change. Generally, resistance in the sensing structure 104 will vary in nearly linear proportion with change in the magnetization direction of the sensing structure 104. This relationship is described in the March 1999 Sensors magazine article, "AMR Magnetic Field Sensors," by Caruso, et al., http://www.sensorsmag.com/articles/0399/0399_18/main.shtml. "AMR Magnetic Field Sensors" is fully incorporated herein by reference.

Therefore, the first resistance change may be used as an indication of the change in the direction of magnetization of the sensing structure 104 away from the first magnetization direction. Thus, when one knows the value of the first resistance and the first magnetization direction of the sensing structure 104, one may calculate the second magnetization direction by measuring the second resistance. When the first resistance and first magnetization directions correspond to a known baseline state, the need to re-measure them before an external field is applied may be obviated. But, if the baseline resistance and magnetization direction are not used, one may need to re-determine the first magnetization direction and resistance prior to each measurement by the MR sensor. An advantage of using a baseline state is that only one resistance value needs to be measured to calculate the magnetization direction resulting from a particular magnetic field.

Moreover, during use, the sensing structure 104 may be exposed to disturbing magnetic fields, which may fracture the sensing structure 104 into multiple magnetic domains. In this situation, an external field may affect different parts of the magnetic sensing structure 104 differently. This may lead to an inaccurate determination of the direction of the external field, and it may render the direction determinations inconsistent for similar external fields. Therefore, it is preferable to reset the sensing structure 104 to a baseline state prior to measuring an external field.

During a set-reset pulse, the amount of current necessary to generate sufficient magnetic flux to set or reset the sensing structure 104 may be substantial. For example, in some applications, a two-amp pulse may be required. At the same time, MR sensors are used in applications where significant size or power constraints may limit the ability to deliver such a substantial pulse. Particularly in applications where the sensor components may be only a few microns thick, the set-reset strap 106 may be physically unable to carry the necessary current pulse. Also, a power supply may not be feasibly available to deliver the necessary current or to deliver such a current consistently.

Furthermore, because the magnetic flux generated by the set-reset strap 106 encircles the strap, parts of the generated flux will be concentrated towards the sensing structure 104, and parts of the generated flux will be concentrated away from the sensing structure 104. This latter magnetic flux may be essentially unused or under-used in view of the purpose of setting or resetting the sensing structure 104. In situations where because of space or other constraints, the available or allowable current is limited, the keeper material 108 may assist in concentrating this unused or under-used magnetic flux onto the sensing structure 104. The keeper material 108 may consist of permalloy-type materials known in the art or their compounds, which may include, for example, nickel, iron, cobalt, or compounds of such materials. Because of the concentrating effect of the keeper material 108, in some cases, the set-reset strap 106 may generate less magnetic flux than previously necessary but still achieve the desired setting or resetting. This diminished magnetic flux may be generated by a lower strength current through the set-reset strap 106 than previously necessary.

The keeper material 108 is provided proximate to the sensing structure 104, so as to concentrate magnetic flux onto the sensing structure 104. Preferably, the keeper material 108 may be layered above the sensing structure 104 and the set-reset strap 106 on the substrate 102, such that the keeper material 108 is directly above, though not in contact with the sensing structure 104. Even so, the keeper material 108 need not be directly above the sensing structure 104, so long as it is near enough to the sensing structure 104 to concentrate magnetic flux onto the sensing structure 104.

Figure 2:
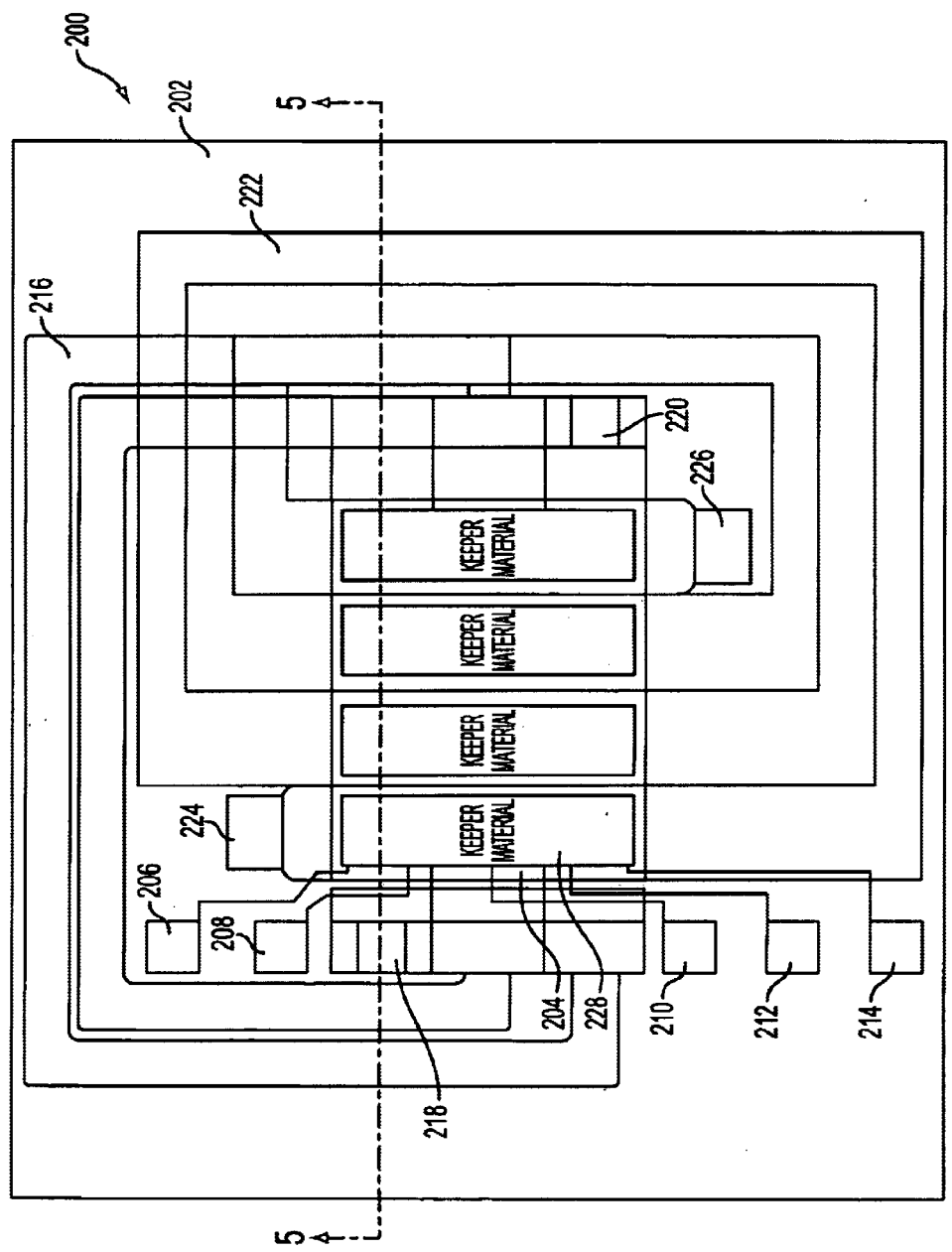
FIG. 2 is a diagram illustrating a preferred embodiment of a sensor in accordance with the present invention.
Figure 3:
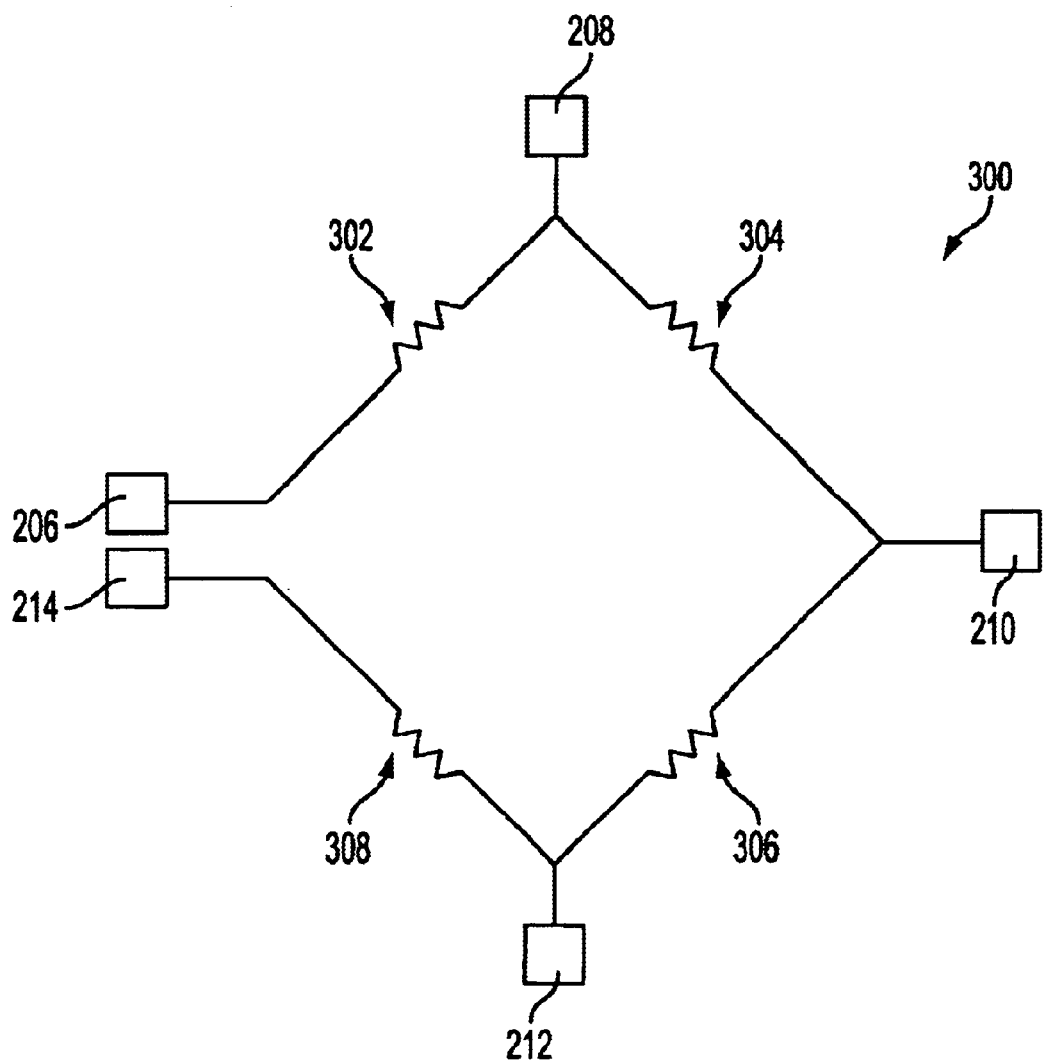
FIG. 3 is an electrical schematic diagram of a configuration of the magnetic field sensing structure 204 and sensing terminals 206, 208, 210, 212, 214 of FIG. 2.

FIG. 2 discloses a substrate 202, a magnetic field sensing structure 204, a set-reset strap 222, and an offset strap 216. Also disclosed are set-reset terminals 224, 226, offset terminals 218, 220, and sensing terminals 206, 208, 210, 212, 214. Finally, a keeper material 228 is shown proximate to the sensing structure 204. As in FIG. 1, a known current may be run between the sensing terminals 206, 214 that will yield a voltage drop across the terminals. This voltage drop may be measured, and a sensing structure resistance may be calculated. This embodiment has five sensing terminals 206, 208, 210, 212, 214, as opposed to FIG. 1, which has only two sensing terminals 110, 112. These excess terminals may allow the sensing structure to be configured in more complex ways than the sensing structure of FIG. 1. For example, the sensing structure of FIG. 2 may be configured as a resistance bridge—such as a Wheatstone bridge—an inductance bridge, or another desired configuration. A Wheatstone bridge circuit configuration is shown in FIG. 3.

The set-reset strap 222 operates in a similar manner to the set-reset structure 106 of FIG. 1, except that the set-reset strap 222 of FIG. 2 is arranged in a serpentine pattern. A serpentine pattern may be a spiral—as shown in FIG. 2—an "S" shape, a "U" shape, a zigzag shape, a combination of these, or a shape in which the strap or strap pieces are curved or angled.

When a reset pulse current is run from set-reset terminal 224 through set-reset terminal 226, the magnetic field direction of the sensing structure 204 may reset into its baseline magnetization direction-typically, along its long axis. Because of the barber-pole biasing of the strips, this baseline magnetic direction may be at a 45-degree angle to the direction of current flow through the set-reset strap 222. When oriented this way, the change in resistance of the sensing structure 204 is almost linearly proportional to the change in magnetization direction, as discussed in "AMR Magnetic Field Sensors."

This embodiment also has an offset strap 216, unlike the embodiment of FIG. 1. When a current is run from offset terminal 218 through offset terminal 220, one may bias the sensing structure 204 elements to, for example, compensate for background magnetic fields. In this embodiment, the current in the offset strap 216 generates magnetic flux perpendicular to the long axis of the sensing structure 204 elements. The current is run through the offset strap 216 in a consistent direction, biasing all of the sensing structure 204 elements in the same direction. If desired, the offset strap may be configured so as to bias different sensing structure 204 elements in different directions, as well. Several additional uses of the offset strap 216 may be found in U.S. Pat. No. 5,247,278 to Pant.

FIG. 2 provides a keeper material 228, which concentrates the magnetic flux over the sensing structure 204 elements. As noted earlier, the keeper material 228 may concentrate the magnetic flux of the set-reset strap 222, and the keeper material 228 will also concentrate the flux generated by the offset strap 216. Therefore, in some cases, because of the concentrating effect of the keeper material 228, the offset strap 216 may generate less magnetic flux than previously necessary but still achieve the desired biasing of the sensing structure 204. This diminished magnetic flux may be generated by a lower strength current through the offset strap 216 than previously necessary.

Turning now to FIG. 3, that figure shows an electrical schematic of a Wheatstone bridge 300, formed by the magnetic field sensing structure 204 and the sensing terminals 206, 208, 210, 212, 214 of FIG. 2. In this figure, the magnetic field sensing structure 204 is represented by four sensing structure elements 302, 304, 306, 308, as divided by the sensing terminals 206, 208, 210, 212, 214. Bridge 300 is a magnetic field sensor sensitive to external magnetic fields in a direction perpendicular to sensing structure 204. With terminal 206 connected to terminal 214 and a voltage applied between terminals 208 and 212, the output of bridge 300 will be between terminals 206 and 210.

Figure 4:
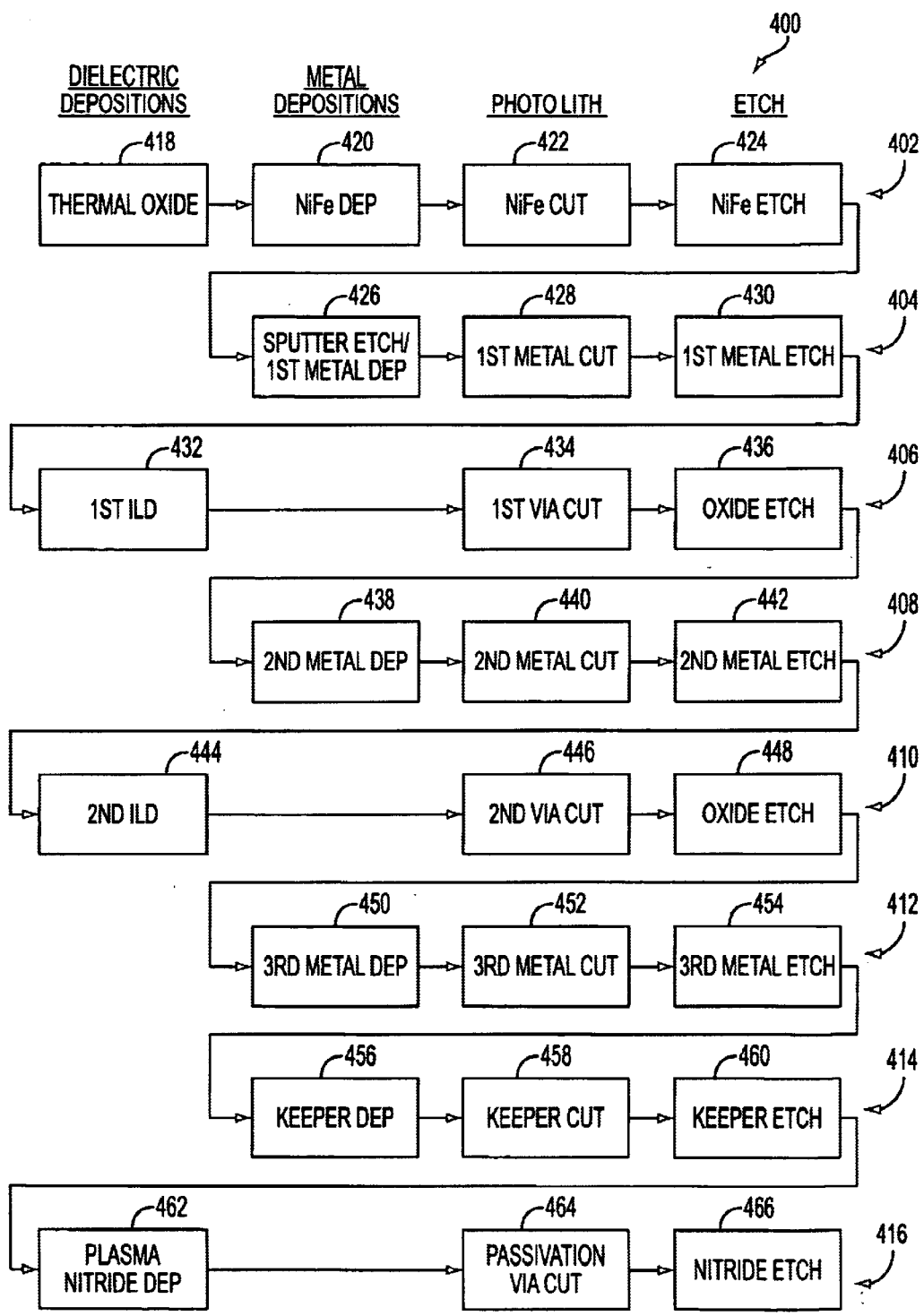
FIG. 4 is a flow diagram of an exemplary method for making a sensor in accordance with the present invention.
Figure 5:
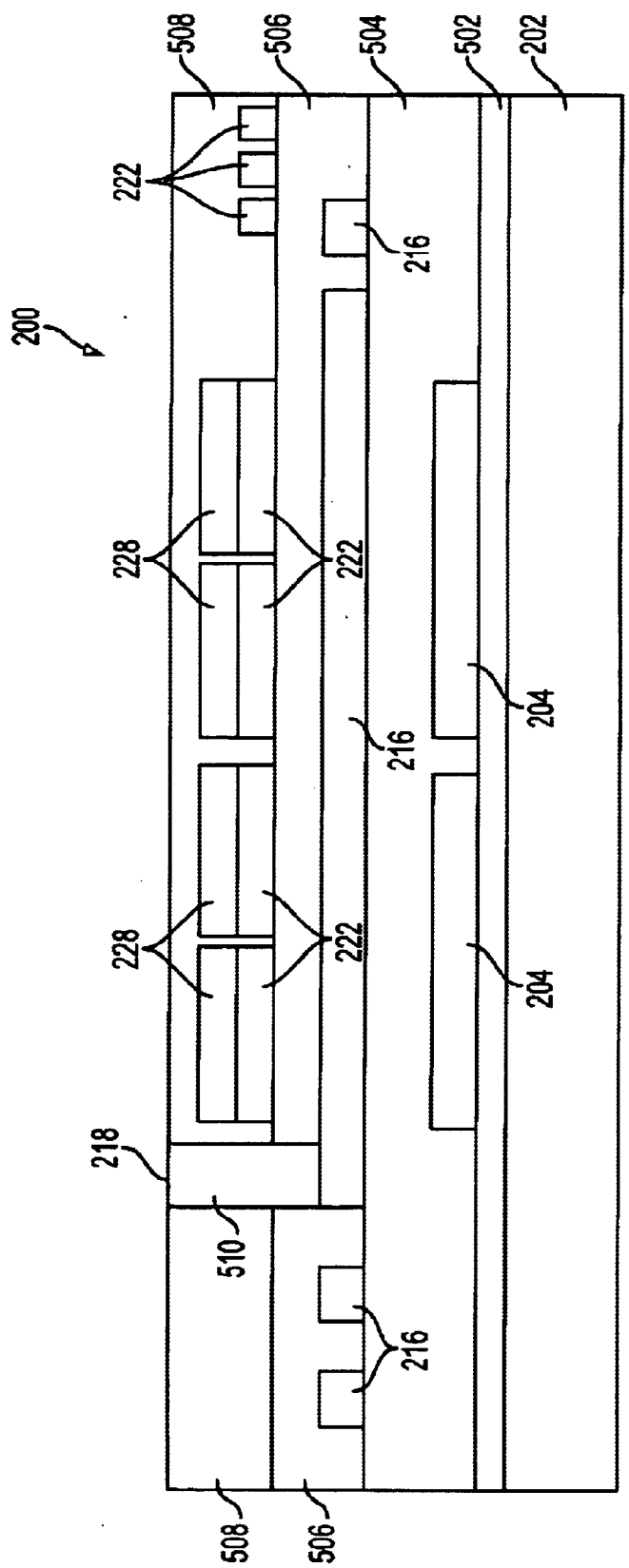
FIG. 5 is a cutaway view of the substrate layer of a sensor in accordance with a preferred embodiment of the present invention.

Turning now to FIGS. 4 and 5, FIG. 4 shows a process flow 400 of an exemplary method of forming the sensor 200 of FIG. 2. FIG. 5 shows a cutaway view of the exemplary MR sensor 200 from the horizontal, along line 5—5 of FIG. 2. In FIG. 4, we see that preferably eight layer steps 402, 404, 406, 408, 410, 412, 414, 416, in which materials are deposited onto a substrate 202, are performed, with up to four substeps shown per layer. Deposition, cutting, etching, and other steps used in photolithographic processes are described in *Microchip Fabrication,* Fourth Edition, by Peter Van Zant. *Microchip Fabrication* by Van Zant is fully incorporated herein by reference. General methods of MR sensor fabrication are also described in U.S. Pat. No. 5,820, 924 dated Oct. 13, 1998 to Witcraft et al., and assigned to the same assignee as the present application. U.S. Pat. No 5,820,924 is fully incorporated herein by reference.

In the first substep 418 of layer step 402, a thermal oxide is deposited as a dielectric. The thermal oxide may be chosen from the many known dielectrics in the art, such as, but not limited to, silicon dioxide. In an exemplary embodiment, shown in FIG. 5, the thermal oxide corresponds to layer 502, and it has been deposited on the substrate 202. Then, in substep 420, permalloy is deposited onto the wafer. This permalloy is preferably 81% nickel and 19% iron. After this, by a photolithography process, the permalloy is cut in substep 422 and, finally, etched in substep 424. In this embodiment, the permalloy deposited in this layer step 402 is cut and etched into the permalloy strips noted in the magnetic field sensing structure 204 of FIGS. 2 and 5.

In substep 426 of the second layer step 404, sputter etching is performed, along with the deposition of a first metal. This first metal may be composed of metals or alloys known in the art for sensor connections, such as, but not limited to, an alloy of aluminum, copper, and tin. The first metal is then cut via a photolithography process in substep 428 and etched in substep 430. The metal remaining at this point forms the metal layer 503, shown in FIG. 5. This layer step 404 provides for the first metal connections 503 between the permalloy strips of the sensing structure 204. Also, the connections for sensing terminals 206, 208, 210, 212, 214 may be formed in this layer step 404.

The next layer step 406 places a dielectric layer over the sensing structure 204. The dielectric is deposited in substep 432 onto the wafer. A via cut is performed in substep 434, and oxide etching is performed in substep 436. The dielectric remaining at this point forms dielectric layer 504, shown in FIG. 5. In a preferred embodiment shown in FIG. 5, the first dielectric layer 504 is used to electrically separate the sensing structure 204 from the offset strap 216, the set-reset strap 222, and the keeper material 228. The first dielectric may be chosen from the many known dielectrics in the art, such as, but not limited to, silicon dioxide.

Next, a second metal layer is formed in layer step 408. In the second metal layer step 408, as in the first metal layer step 404, the second metal is deposited in substep 438. This metal may be composed of the same material as the first metal layer 503, or it may be composed of any of the metals or alloys known in the art for current straps. Then, this metal is cut in substep 440, and etched in substep 442. In a preferred embodiment, shown in FIG. 5, the metal layer remaining at this point will serve as the offset strap 216 for the sensor 200. Nonetheless, this layer may serve as a set-reset strap or other type of current strap, or this layer may be omitted completely.

After this, a second dielectric layer step 410 is performed. The second dielectric is deposited in substep 444, via cut in substep 446, and etched in substep 448. The dielectric remaining at this point forms dielectric layer 506, shown in FIG. 5. The second dielectric layer 506 may use the same dielectric material as the first dielectric layer 504 used or any of the other dielectric materials known in the art. In an embodiment shown in FIG. 5, the second dielectric layer 506 separates the set-reset strap 222 from the offset strap 216 and the sensing structure 204. Separation, in the context of the dielectric layers, does not require the layers being separated to be adjacent to the dielectric layer. For example, in this embodiment, the second dielectric layer 506 separates the set-reset strap 222 and the sensing structure 204, even though the sensing structure 204 is located several layers away from the second dielectric layer 506 and set-reset strap 222. In embodiments where the second or third metal layers are omitted, the second dielectric layer 506 may be omitted.

The third metal layer step 412 is performed in a similar manner to the second metal layer step 408. The third metal is deposited in substep 450, cut in substep 452, and etched in substep 454. In a preferred embodiment, shown in FIG. 5, the third metal layer may serve as a set-reset strap 222 for the sensor 200. Alternately, the third metal layer may also serve as an offset strap or other current strap. Like the second metal layer, the third metal layer may be omitted, as well. Even so, at least one of these two metal layers should be present to utilize the concentrating effects of the keeper material 228. This third metal layer may also be composed of metals or alloys known in the art for current straps, such as an alloy of aluminum, copper, and tin.

In layer step 414, the keeper material 228 is deposited in substep 456, cut in substep 458, and etched in substep 460. The keeper material 228 may be composed of permalloy-type materials known in the art or their compounds, which may include, for example, nickel, iron, cobalt, or compounds of such materials. In the embodiment, shown in FIG. 5, the keeper material 228 is immediately adjacent to the set-reset strap 222, and preferably, the keeper material 228 is also as close to the offset strap 216 as is feasible. In this way, the keeper material 228 may more effectively concentrate the magnetic flux generated by the current straps 216, 222. Still, the keeper material 228 may be separated from the current straps 216, 222 by intervening layers.

Layer step 416 begins by depositing plasma nitride on the wafer in substep 462. Next, substep 464 provides for a passivation via cut, and in substep 466, a nitride etch is performed. The plasma nitride layer 508 is shown in the exemplary embodiment in FIG. 5.

Reviewing once more the features of the exemplary embodiment shown in FIG. 5, that figure shows a cutaway view of the MR sensor 200 from the horizontal, along line 5—5 of FIG. 2. The figure shows the substrate layer 202, a thermal oxide layer 502, the sensing structure 204, the first dielectric layer 504, the offset strap 216, the second dielectric layer 506, the set-reset strap 222, the keeper material 228, and a plasma nitride layer 508. The first dielectric layer 504 covers the sensing structure 204. Above the first dielectric layer 504 sits the offset strap 216. The offset strap 216 runs parallel to line 5 while passing over the sensing structure 204. The offset strap 216 lies under the second dielectric layer 506. There is an offset via 510 cut through the second dielectric layer 506 and the plasma nitride layer 508 that connects with offset terminal 218. The set-reset strap 222 sits atop the second dielectric layer 506. The keeper material 228 sits atop the set-reset strap 222. The keeper material 228 and set-reset strap 222 lie beneath the plasma nitride layer 508.

Set-reset straps and offset straps according to embodiments of the present invention may be utilized before every measurement, if desired. However, in some applications, it may be preferable to use set-reset and/or offset straps only in certain instances, such as upon power-up of an MR sensor device. Similarly, the occurrence of an anomalous magnetic field may be an appropriate time for using set-reset straps and/or offset straps, in order to reset the domain state of an MR sensor and/or to bias an MR sensor. The set-reset and offset straps could also be used for compensating for stray fields, calibration, current measurements, or magnetic initialization (startup).

In view of the wide variety of embodiments to which the principles of the present invention can be applied, it should be understood that the illustrated embodiments are exemplary only, and should not be taken as limiting the scope of the present invention.

The claims should not be read as limited to the described order or elements unless stated to that effect. Therefore, all embodiments that come within the scope and spirit of the following claims and equivalents thereto are claimed as the invention.

What is claimed is:

1. A method of manufacturing a magnetic field sensor for sensing external magnetic fields wherein the magnetic field sensor includes at least a substrate, a magnetic field sensing structure, and at least one current strap operative to generate a magnetic field to set a baseline state of the magnetic field sensor, comprising providing a keeper material proximate to at least a portion of the magnetic field sensing structure to concentrate the magnetic field onto the magnetic field sensing structure, thereby assisting in setting the baseline state of the magnetic field sensor.

2. The method of claim 1, wherein one of the at least one current straps is a set-reset strap or an offset strap, each operable to set the baseline state of the magetic field sensor.

3. The method of claim 1, wherein the at least one current strap includes a set-reset strap and an offset strap, operable in combination to set the baseline state of the magnetic field sensor.

4. The method of claim 3, wherein the magnetic field sensor further includes a dielectric layer separating at least a portion of the set-reset strap and the offset strap.

5. The method of claim 1, wherein the magnetic field sensor further includes a dielectric layer separating at least a portion of the at least one current strap from the magnetic field sensing structure.

6. The method of claim 1, further comprising the steps of:
providing a layer of photoresist adjacent to the keeper material;
exposing the layer of photoresist in a photolithography process;
developing the photoresist; and
etching the keeper material.

7. The method of claim 1, wherein the magnetic field sensing structure includes at least one magnetic strip for magnetic field sensing.

8. The method of claim 7, wherein the at least one magnetic strip is a permalloy strip.

9. The method of claim 7, wherein the at least one magnetic strip is barber-pole biased.

10. The method of claim 7, wherein the magnetic field sensing structure includes a plurality of magnetic strips for magnetic field sensing.

11. The method of claim 10, wherein at least two of the magnetic strips are arranged substantially parallel to one another.

12. The method of claim 10, wherein at least two of the magnetic strips are electrically connected in series with one another.

13. The method of claim 12, wherein the at least two series-connected magnetic strips are electrically connected to at least two other series-connected magnetic strips.

14. The method of claim 12, wherein the at least two series-connected magnetic strips are electrically connected to at least one sensing terminal.

15. The method of claim 1, wherein the magnetic field sensing structure is operative to produce a magnetic field indication when a current is applied to the magnetic field sensing structure, and wherein the magnetic field indication represents a magnetization direction of an externally applied field.

16. The method of claim 15, wherein the magnetic field sensing structure includes a bridge circuit for producing the magnetic field indication, and wherein the bridge circuit is an impedance bridge circuit or a resistive bridge circuit.

17. The method of claim 1, wherein the at least one current strap is arranged substantially in a serpentine pattern.

18. The method of claim 1, wherein the keeper material includes nickel, iron, or cobalt.

19. The method of claim 1, wherein the baseline state of the magnetic field sensor includes a component selected from the group consisting of a reset state and a bias state.

20. A magnetic field sensing device for sensing external magnetic fields, comprising in combination:
a substrate;
a magnetic field sensing structure disposed on the substrate;
at least one current strap disposed proximate to the sensing structure for generating a magnetic field proximate to the sensing structure, wherein the at least one current strap is operative to generate a magnetic field to set a baseline state of the magnetic field sensing device; and
a keeper layer disposed substantially opposite the at least one current strap from the sensing structure,
whereby the keeper layer is positioned relative to the magnetic field sensing structure and the at least one current strap to concentrate the magnetic field onto the magnetic field sensing structure to assist in setting the baseline state of the magnetic field sensing device.

21. The magnetic field sensing device of claim 19, wherein one of the at least one current straps is a set-reset strap or an offset strap, each operable to set the baseline state of the magnetic field sensing device.

22. The magnetic field sensing device of claim 19, wherein the at least one current strap includes a set-reset strap and an offset strap, operable in combination to set the baseline state of the magnetic field sensing device.

23. The magnetic field sensing device of claim 22, wherein the magnetic field sensing device further includes a dielectric layer separating at least a portion of the set-reset strap and the offset strap.

24. The magnetic field sensing device of claim 10, wherein the magnetic field sensing device further includes a dielectric layer separating at least a portion of the at least one current strap from the magnetic field sensing structure.

25. The magnetic field sensing device of claim 20, wherein the keeper layer is produced by a photomasking process.

26. The magnetic field sensing device of claim 20, wherein the magnetic field sensing structure has at least one magnetic strip for magnetic field sensing.

27. The magnetic field sensing device of claim 26, wherein the at least one magnetic strip is a permalloy strip.

28. The magnetic field sensing device of claim 26, wherein the at least one magnetic strip is barber-pole biased.

29. The magnetic field sensing device of claim 19, wherein the magnetic field sensing structure has a plurality of magnetic strips for magnetic field sensing.

30. The magnetic field sensing device of claim 29, wherein at least two of the magnetic strips are arranged substantially parallel to one another.

31. The magnetic field sensing device of claim 29, wherein at least two of the magnetic strips are electrically connected in series with one another.

32. The magnetic field sensing device of claim 31, wherein the at least two series-connected magnetic strips are electrically connected to at least two other series-connected magnetic strips.

33. The magnetic field sensing device of claim 31, wherein the at least two series-connected magnetic strips are electrically connected to at least one sensing terminal.

34. The magnetic field sensing device of claim 20, wherein the sensing structure is operative to produce a magnetic field indication when a current is applied to the sensing structure, and wherein the magnetic field indication represents magnetic field strength of an externally applied field.

35. The magnetic field sensing device of claim 34, wherein the sensing structure includes a bridge circuit for producing the magnetic field indication, and wherein the bridge circuit is an impedance bridge circuit or a resistive bridge circuit.

36. The magnetic field sensing device of claim 20, wherein the at least one current strap is arranged in a serpentine pattern.

37. The magnetic field sensing device of claim 20, wherein the keeper layer includes nickel, iron, or cobalt.

38. A magnetic field sensor, comprising:

a substrate;

a magnetic field sensing structure disposed on the substrate;

at least one current strap separated from the sensing structure by at least one spacer layer, the at least one current strap being operative to generate a magnetic flux to set a baseline state of the magnetic field sensor, wherein the magnetic flux has at least a first portion directed towards the sensing structure and at least a second portion directed away from the sensing structure; and a keeper layer located proximate the at least one current strap to concentrate at least the second portion onto the sensing structure, thereby increasing the concentration of the magnetic flux through the sensing structure to assist in setting the baseline state of the magnetic field sensor.

39. The magnetic field sensor of claim 38, wherein one of the at least one current straps is a set-reset strap or an offset strap, each operable to set the baseline state of the magnetic field sensor.

40. The magnetic field sensor of claim 38, wherein the at least one current strap includes a set-reset strap and an offset strap, operable in combination to set the baseline state of the magnetic field sensor.

41. The magnetic field sensor of claim 40, wherein the magnetic field sensor further includes a spacer layer separating at least a portion of the set-reset strap and the offset strap.

42. The magnetic field sensor of claim 41, wherein the spacer layer is a dielectric layer.

43. The magnetic field sensor of claim 40, wherein the at least one spacer layer is a dielectric layer.

44. The magnetic field sensor of claim 40, wherein the keeper layer is separated from the at least one the current strap by at least one spacer layer.

45. The magnetic field sensor of claim 40, wherein the keeper layer is immediately adjacent to the at least one current strap.

46. The magnetic field sensor of claim 44, wherein the at least one spacer layer is a dielectric layer.

47. The magnetic field sensor of claim 38, wherein the magnetic field sensing structure has at least one magnetic strip for magnetic field sensing.

48. The magnetic field sensor of claim 47, wherein the at least one magnetic strip is a permalloy strip.

49. The magnetic field sensor of claim 38, wherein the keeper layer includes nickel, iron, or cobalt.

\* \* \* \* \*

UNITED STATES PATENT AND TRADEMARK OFFICE
CERTIFICATE OF CORRECTION

PATENT NO. : 6,717,403 B2
DATED : April 6, 2004
INVENTOR(S) : William F. Witcraft and Joon-Wan Kang It is certified that error appears in the above-identified patent and that said Letters Patent is hereby corrected as shown below:

Title page,
*Assistant Examiner*, "Reene" should read -- Reena --.

Column 2,
Line 65, "inventions" should read -- invention --.

Column 7,
Line 5, delete "the" and insert -- a first --.
Line 5, delete "503, shown in FIG. 5".
Line 6, delete "503".
Line 25, delete "503".

Column 8,
Line 3, after the word "embodiment", delete a comma ",".
Line 59, after the word "fields", insert a comma -- , --.

Column 10,
Line 2, delete "a" and insert -- the --.
Lines 12, 16 and 38, "claim 19" should read -- claim 20 --.
Line 24, "claim 10" should read -- claim 20 --.

Column 12,
Lines 9, 11 and 14, "claim 40" should read -- claim 38 --.

Signed and Sealed this

Twenty-seventh Day of July, 2004

JON W. DUDAS
*Acting Director of the United States Patent and Trademark Office*